United States Patent
Conn et al.

(10) Patent No.: US 10,178,807 B2
(45) Date of Patent: *Jan. 8, 2019

(54) TOP LOADING CARTRIDGE

(71) Applicant: HEWLETT PACKARD ENTERPRISE DEVELOPMENT LP, Houston, TX (US)

(72) Inventors: Kevin D Conn, Montgomery, TX (US); Keith J Kuehn, Magnolia, TX (US); Thomas Robert Bowden, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 256 days.

This patent is subject to a terminal disclaimer.

(21) Appl. No.: 14/780,521

(22) PCT Filed: Mar. 26, 2013

(86) PCT No.: PCT/US2013/033910
§ 371 (c)(1),
(2) Date: Sep. 25, 2015

(87) PCT Pub. No.: WO2014/158142
PCT Pub. Date: Oct. 2, 2014

(65) Prior Publication Data
US 2016/0050795 A1 Feb. 18, 2016

(51) Int. Cl.
*H05K 7/20* (2006.01)
*G06F 1/18* (2006.01)
*H05K 7/14* (2006.01)

(52) U.S. Cl.
CPC ......... *H05K 7/20736* (2013.01); *G06F 1/181* (2013.01); *G06F 1/183* (2013.01); *H05K 7/1485* (2013.01)

(58) Field of Classification Search
CPC .................. H05K 7/20736; H05K 7/1485
See application file for complete search history.

(56) References Cited

U.S. PATENT DOCUMENTS

| | | | |
|---|---|---|---|
| D316,546 S | 4/1991 | Pedinielli | |
| 5,211,459 A | 5/1993 | Wu | |

(Continued)

FOREIGN PATENT DOCUMENTS

| | | |
|---|---|---|
| CN | 1305690 A | 7/2001 |
| CN | 1464352 | 12/2003 |

(Continued)

OTHER PUBLICATIONS

EPO Partial Supplementary Search Report dated Dec. 20, 2016 for EP Application No. 13880430.7; pp. 12.

(Continued)

*Primary Examiner* — Hoa C Nguyen
*Assistant Examiner* — Keith DePew
(74) *Attorney, Agent, or Firm* — Hewlett Packard Enterprise Patent Department

(57) ABSTRACT

A top loading cartridge is provided herein. The top loading cartridge includes a support member, a rail member, and a lock mechanism. The support member to receive an electronic module. The rail member attached to the support member to engage with a tray that receives the top loading server cartridge. The lock mechanism to lock the top loading cartridge.

15 Claims, 19 Drawing Sheets

(56) References Cited

U.S. PATENT DOCUMENTS

| | | |
|---|---|---|
| 5,506,750 A | 4/1996 | Carteau et al. |
| 5,691,879 A | 11/1997 | Lopez et al. |
| D393,632 S | 4/1998 | Sherry |
| D399,498 S | 10/1998 | Chang |
| 5,868,261 A | 2/1999 | Collins et al. |
| 5,989,043 A | 11/1999 | Han et al. |
| 6,052,278 A | 4/2000 | Tanzer et al. |
| 6,058,016 A | 5/2000 | Anderson et al. |
| 6,058,579 A | 5/2000 | Brocklesby et al. |
| 6,067,225 A | 5/2000 | Reznikov et al. |
| 6,091,571 A | 7/2000 | Hanson |
| 6,247,944 B1 * | 6/2001 | Bologna ............... G06F 1/184 439/157 |
| 6,272,011 B1 | 8/2001 | Chen |
| D447,484 S | 9/2001 | Reznikov |
| 6,288,897 B1 | 9/2001 | Fritschle |
| 6,356,441 B1 | 3/2002 | Claprood |
| D458,924 S | 6/2002 | Tsuyuki |
| 6,450,597 B1 | 9/2002 | Bell et al. |
| 6,490,153 B1 | 12/2002 | Casebolt |
| 6,603,661 B2 | 8/2003 | Smith |
| 6,612,667 B2 | 9/2003 | Tsai et al. |
| 6,654,252 B2 | 11/2003 | Raynham |
| D484,509 S | 12/2003 | Frank et al. |
| 6,724,614 B1 | 4/2004 | Chiang et al. |
| 6,757,748 B1 | 6/2004 | Hipp |
| D494,975 S | 8/2004 | McClelland |
| 6,839,233 B2 * | 1/2005 | Cravens ............... H05K 7/20727 361/695 |
| 6,839,237 B2 | 1/2005 | Berry et al. |
| 6,862,173 B1 | 3/2005 | Konshak et al. |
| 6,901,631 B1 | 6/2005 | Lin |
| 6,912,132 B2 | 6/2005 | Riddiford et al. |
| 6,952,341 B2 | 10/2005 | Hidaka |
| 7,031,153 B2 | 4/2006 | Tanaka et al. |
| 7,039,299 B2 | 5/2006 | Onodera |
| 7,054,163 B2 | 5/2006 | Coffey |
| 7,185,124 B2 | 2/2007 | Matsushige et al. |
| 7,193,856 B2 | 3/2007 | Hidaka |
| 7,200,008 B1 | 4/2007 | Bhugra |
| D545,321 S | 6/2007 | Frank et al. |
| 7,254,017 B2 | 8/2007 | Peng |
| 7,304,855 B1 | 12/2007 | Milligan et al. |
| 7,312,999 B1 | 12/2007 | Miyamura et al. |
| 7,321,489 B2 | 1/2008 | McAlister |
| 7,379,294 B2 | 5/2008 | Chen |
| 7,408,772 B2 | 8/2008 | Grady et al. |
| 7,583,497 B2 | 1/2009 | Roesner |
| D588,132 S | 3/2009 | Lauffer |
| 7,511,953 B2 | 3/2009 | Tao |
| 7,576,977 B2 | 8/2009 | Signer et al. |
| 7,583,507 B2 | 9/2009 | Starr et al. |
| 7,639,486 B2 | 12/2009 | Champion et al. |
| 7,660,108 B2 | 2/2010 | Baker et al. |
| 7,675,750 B1 | 5/2010 | Tamarkin |
| 7,796,396 B2 * | 9/2010 | Hanson ............... E05C 1/10 211/26 |
| 7,808,777 B2 | 10/2010 | Luo |
| 7,855,938 B2 | 12/2010 | Hoelsaeter et al. |
| 7,920,384 B2 * | 4/2011 | Westphall ............... G06F 1/20 361/695 |
| 7,940,521 B2 | 5/2011 | Carlisi |
| 8,009,419 B2 | 8/2011 | Attlesey |
| 8,009,425 B2 | 8/2011 | Kang |
| 8,035,961 B2 | 10/2011 | Figuerado |
| 8,054,638 B2 | 11/2011 | Graybill et al. |
| 8,144,464 B2 | 3/2012 | VanDerVeen |
| 8,199,511 B2 | 6/2012 | Kim |
| 8,248,775 B2 * | 8/2012 | Zhang ............... G11B 33/124 248/27.1 |
| 8,305,754 B2 | 11/2012 | Wu |
| D685,373 S | 7/2013 | Santos |
| 8,553,357 B1 | 10/2013 | Sorenson, III et al. |
| 8,582,303 B2 | 11/2013 | Chiu et al. |
| 8,599,550 B2 | 12/2013 | Davis et al. |
| D711,387 S | 8/2014 | Kuehn |
| 8,915,557 B2 | 12/2014 | Doglio et al. |
| D724,081 S * | 3/2015 | Kuehn ............... D14/367 |
| 8,976,520 B2 | 3/2015 | Yang |
| 9,141,156 B2 | 9/2015 | Ross et al. |
| 9,161,476 B2 | 10/2015 | Doglio et al. |
| 9,363,926 B1 | 6/2016 | Beall et al. |
| 9,736,961 B2 * | 8/2017 | Conn ............... H05K 7/183 |
| 2001/0008480 A1 * | 7/2001 | Huang ............... G11B 33/124 361/679.33 |
| 2002/0008961 A1 | 1/2002 | Amaike |
| 2003/0099094 A1 * | 5/2003 | Coles ............... H05K 7/1409 361/726 |
| 2004/0047128 A1 | 3/2004 | McClelland, II et al. |
| 2004/0075983 A1 | 4/2004 | Thompson |
| 2004/0162018 A1 | 8/2004 | Lee |
| 2004/0240171 A1 | 12/2004 | Liao |
| 2005/0007734 A1 | 1/2005 | Peng et al. |
| 2005/0073809 A1 | 4/2005 | Chang |
| 2005/0254210 A1 * | 11/2005 | Grady ............... H05K 7/20581 361/695 |
| 2006/0012950 A1 | 1/2006 | Shih |
| 2006/0023413 A1 | 2/2006 | Lo et al. |
| 2006/0023430 A1 | 2/2006 | Karstens |
| 2006/0061955 A1 | 3/2006 | Imblum |
| 2007/0014085 A1 | 1/2007 | Meserth et al. |
| 2007/0050644 A1 | 3/2007 | Merkin |
| 2007/0165618 A1 | 7/2007 | Niazi et al. |
| 2007/0206351 A1 | 9/2007 | Szelong et al. |
| 2007/0230111 A1 | 10/2007 | Starr et al. |
| 2008/0212273 A1 | 9/2008 | Bechtolsheim |
| 2009/0116178 A1 | 5/2009 | Champion et al. |
| 2009/0260777 A1 | 10/2009 | Attlesey |
| 2009/0284907 A1 | 11/2009 | Regimbal et al. |
| 2010/0172076 A1 | 7/2010 | Cravens et al. |
| 2010/0284145 A1 | 11/2010 | Kang |
| 2011/0069441 A1 | 3/2011 | Killen et al. |
| 2011/0095151 A1 | 4/2011 | Zhang et al. |
| 2011/0116233 A1 | 5/2011 | Beaudoin et al. |
| 2012/0020008 A1 | 1/2012 | Dunwoody et al. |
| 2012/0027580 A1 * | 2/2012 | Lu ............... F04D 25/0613 415/214.1 |
| 2012/0111534 A1 | 5/2012 | Chen et al. |
| 2012/0120596 A1 * | 5/2012 | Bechtolsheim ............... G06F 1/20 361/679.48 |
| 2012/0236491 A1 | 9/2012 | Wallace |
| 2012/0248952 A1 | 10/2012 | Gong |
| 2014/0084764 A1 | 3/2014 | Doglio et al. |
| 2016/0057885 A1 * | 2/2016 | Conn ............... H05K 7/1489 211/26 |
| 2016/0057887 A1 * | 2/2016 | Conn ............... H05K 7/183 361/679.58 |
| 2016/0278231 A1 * | 9/2016 | Tsai ............... H05K 7/1487 |

FOREIGN PATENT DOCUMENTS

| | | |
|---|---|---|
| CN | 201291450 | 8/2009 |
| CN | 201315040 | 9/2009 |
| CN | 201440335 | 4/2010 |
| CN | 102083288 A | 6/2011 |
| CN | 102118947 | 7/2011 |
| CN | 102576239 | 7/2012 |
| FR | 2834355 | 7/2003 |
| JP | 4126000 | 4/1992 |
| TW | 535046 B | 6/2003 |
| TW | 585293 | 4/2004 |
| TW | M296420 | 8/2006 |
| TW | I321977 | 3/2010 |

OTHER PUBLICATIONS

Cisco Nexus 7000 Series Switches Data Sheet, http://www.cisco.com/en/US/prod/collateral/switches/ps9441/ps9402/ps9512/Data_Sheet_C78-437762.html—Received: Mar. 5, 2013—8pgs.

Partial European Search Report dated Dec. 13, 2016 for EP Application No. 13880248.3; pp. 12.

(56) References Cited

OTHER PUBLICATIONS

Partial European Search Report dated Nov. 3, 2016 for EP Application No. 13880354.9; pp. 11.
PCT/ISA/KR, International Search Report, dated Dec. 11, 2013, PCT/US2013/033910, 14 pages.
PCT/ISA/KR, International Search Report, dated Dec. 11, 2013, PCT/US2013/033914, 13 pages.
PCT/ISA/KR, International Search Report, dated Dec. 11, 2013, PCT/US2013/033917, 11 pages.

\* cited by examiner

900

INSERT A TOP LOADING CARTRIDGE INTO A
TRAY ATTACHED TO A SERVER CHASSIS
920

ROTATE A LOCK MECHANISM TOWARDS
A LOCKED POSITION
940

APPLY A FORCE TO A TAB TO MOVE THE TAB
BETWEEN A FIRST POSITION AND A SECOND POSITION
960

RELEASE THE TAB AFTER THE LOCK MECHANISM
MOVES INTO THE LOCK POSITION, RELEASE OF THE TAB
CAUSES A LOCK ENGAGEMENT MEMBER TO ENGAGE
WITH A SUPPORT MEMBER AND THE TRAY
ENGAGEMENT MEMBER TO ENGAGE WITH THE TRAY TO
ATTACH THE TOP LOADING CARTRIDGE TO THE TRAY
980

APPLY A FORCE TO A TAB TO MOVE THE TAB BETWEEN
A FIRST POSITION AND SECOND POSITION
1020

↓

ROTATE LOCK MECHANISM TOWARDS AN
UNLOCKED POSITION
1040

↓

RELEASE THE TAB AFTER THE LOCK MECHANISM
MOVES INTO THE UNLOCK POSITION
1060

↓

REMOVE THE TOP LOADING CARTRIGE FROM THE TRAY
1080

*Fig. 10*

TOP LOADING CARTRIDGE

BACKGROUND

A data center rack contains electronic components. A chassis fits into the data center rack. The chassis includes a tray to receive electronic components for processing, storage, memory, networking, and cooling. The electronic components may be arranged in a variety of ways depending on the type of electronic component, purpose of the electronic component, and computing needs.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

FIGS. 9-10 illustrate flow charts of methods for modular computing using a top loading cartridge.

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Data center racks are designed to provide a variety of computing solutions. The design of the data center rack must balance conflicts between power density, spatial layout, temperature requirements, acoustic noise, and other factors. The type of electronic components installed in the data center rack depends on the computing solution and the power and cooling requirements. The electronic components are mounted or loaded on a tray in a chassis. The chassis is housed in the data center rack. For example, the electronic components may be electronic modules that are loaded into the front or the side of the chassis. Each chassis may contain a plurality of modules, each containing one or a combination of hard drives, processors, heat sinks, fans, network switches in a single tray. When service is needed, all the modules in the chassis are shut down to access the desired modules.

In examples, a top loading cartridge is provided. The top loading cartridge includes a support member, a rail member, and a lock mechanism. The support member to receive an electronic module. The rail member attached to the support member to engage with a tray that receives the top loading server cartridge. The lock mechanism to lock the top loading cartridge. The top loading cartridge provides the ability increase the density of a chassis and the flexibility to service each top loading cartridge individually without shutting down other cartridges or components on the chassis.

Figure 1:
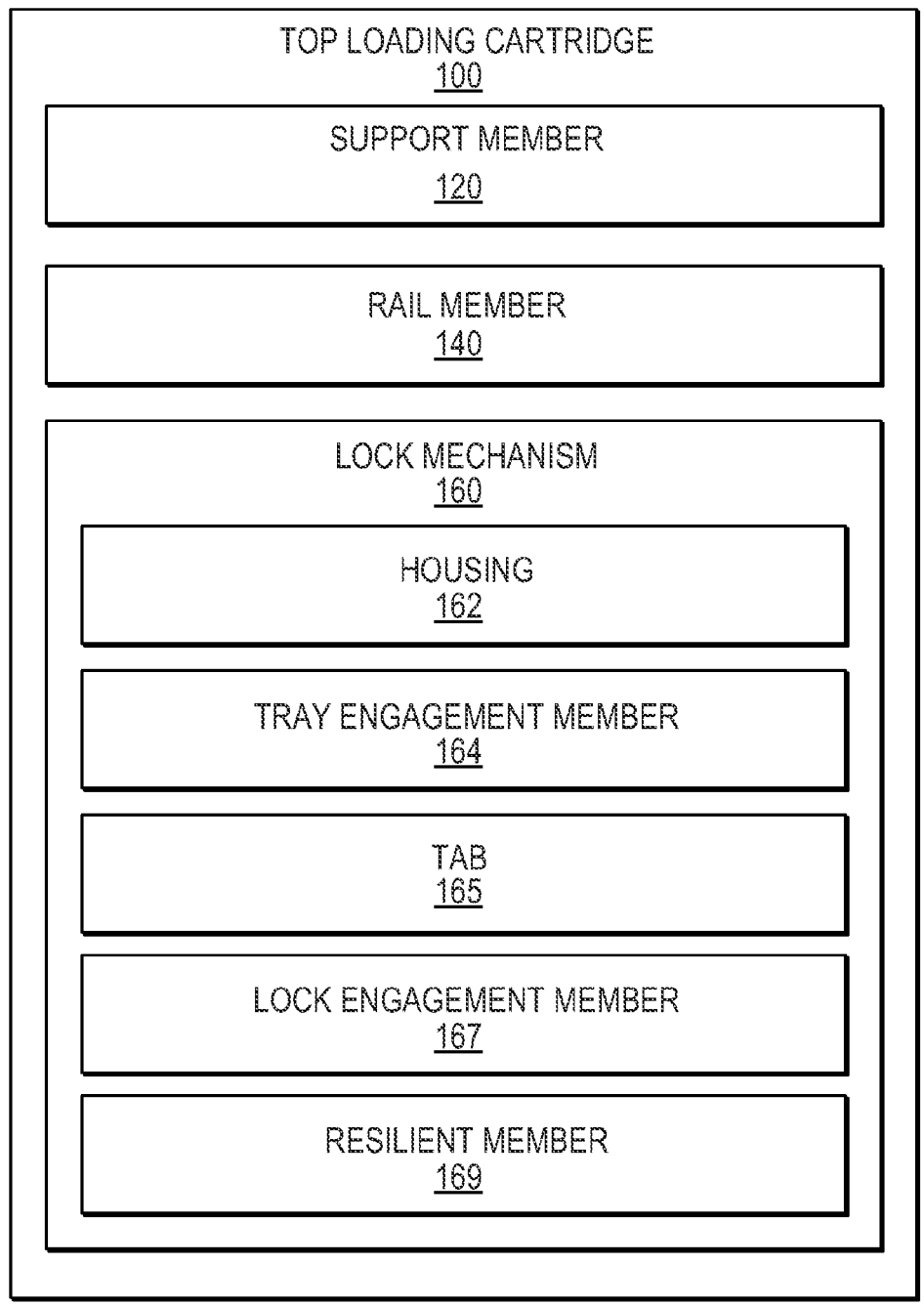
FIG. 1 illustrates a block diagram of a top loading cartridge according to an example.

FIG. 1 illustrates a block diagram a top loading cartridge 100 according to an example. The top loading cartridge 100 includes a support member 120, a rail member 140, and a lock mechanism 160. The support member 120 to receive an electronic module. For example, the electronic module may include a server module, a fan module, and/or a network switch module. The server module includes, for example, a combination of at least one of the following: a hard drive, a processor, a heat sink, and a memory. The fan module includes, for example, at least one fan. The network switch module includes, for example, at least one network switch, a heat sink, and a memory module.

The rail member 140 to attach to the support member 120 to engage with a tray that receives the top loading cartridge 100. The lock mechanism 160 to lock the top loading cartridge 100 in the tray. The lock mechanism 160 includes a housing 162, a tray engagement member 164, a tab 165, a lock engagement member 167, and a resilient member 169.

Figure 2A:
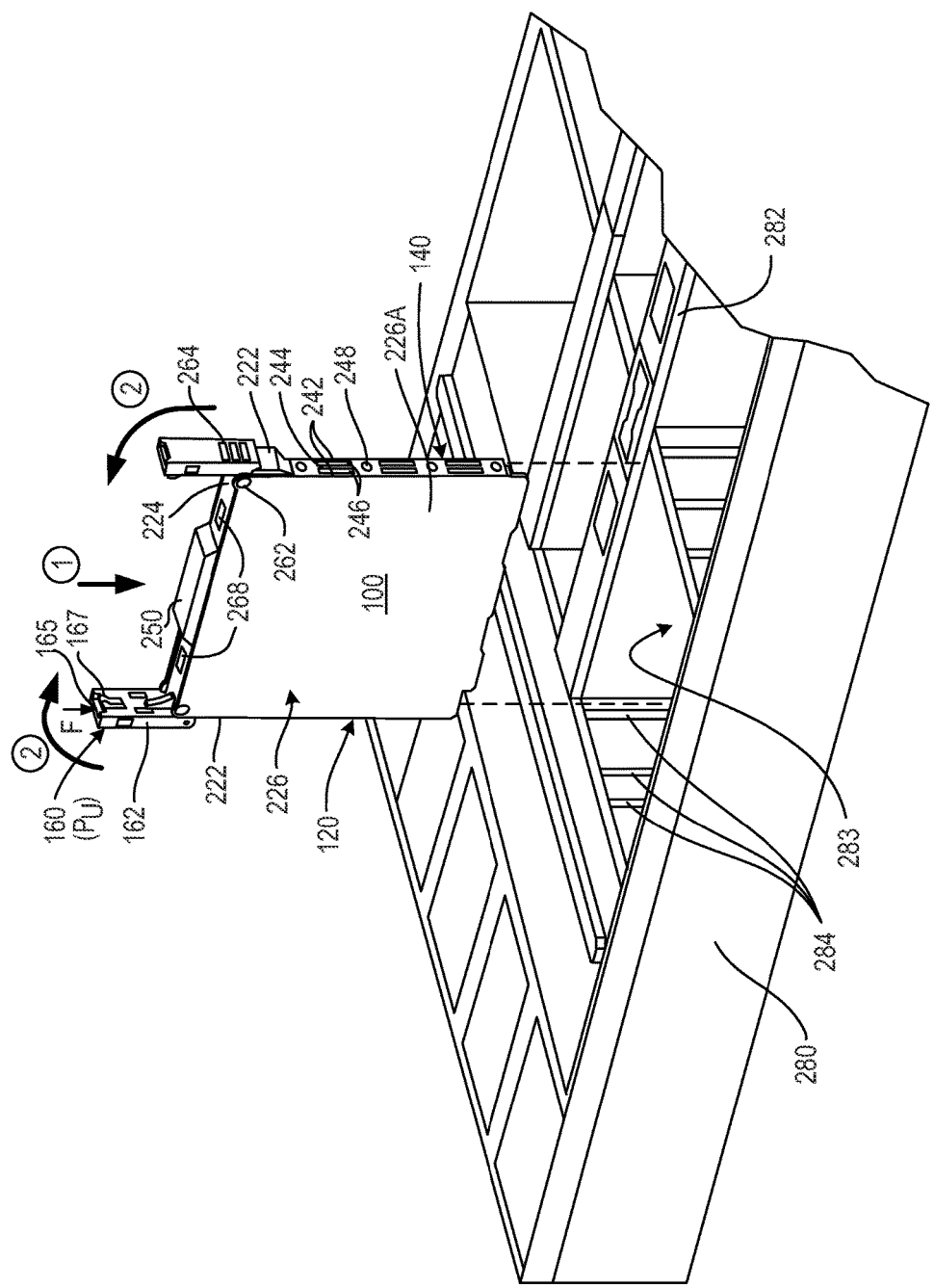
FIGS. 2A-2B illustrate perspective views of the top loading cartridge of FIG. 1 according to examples.
Figure 2B:
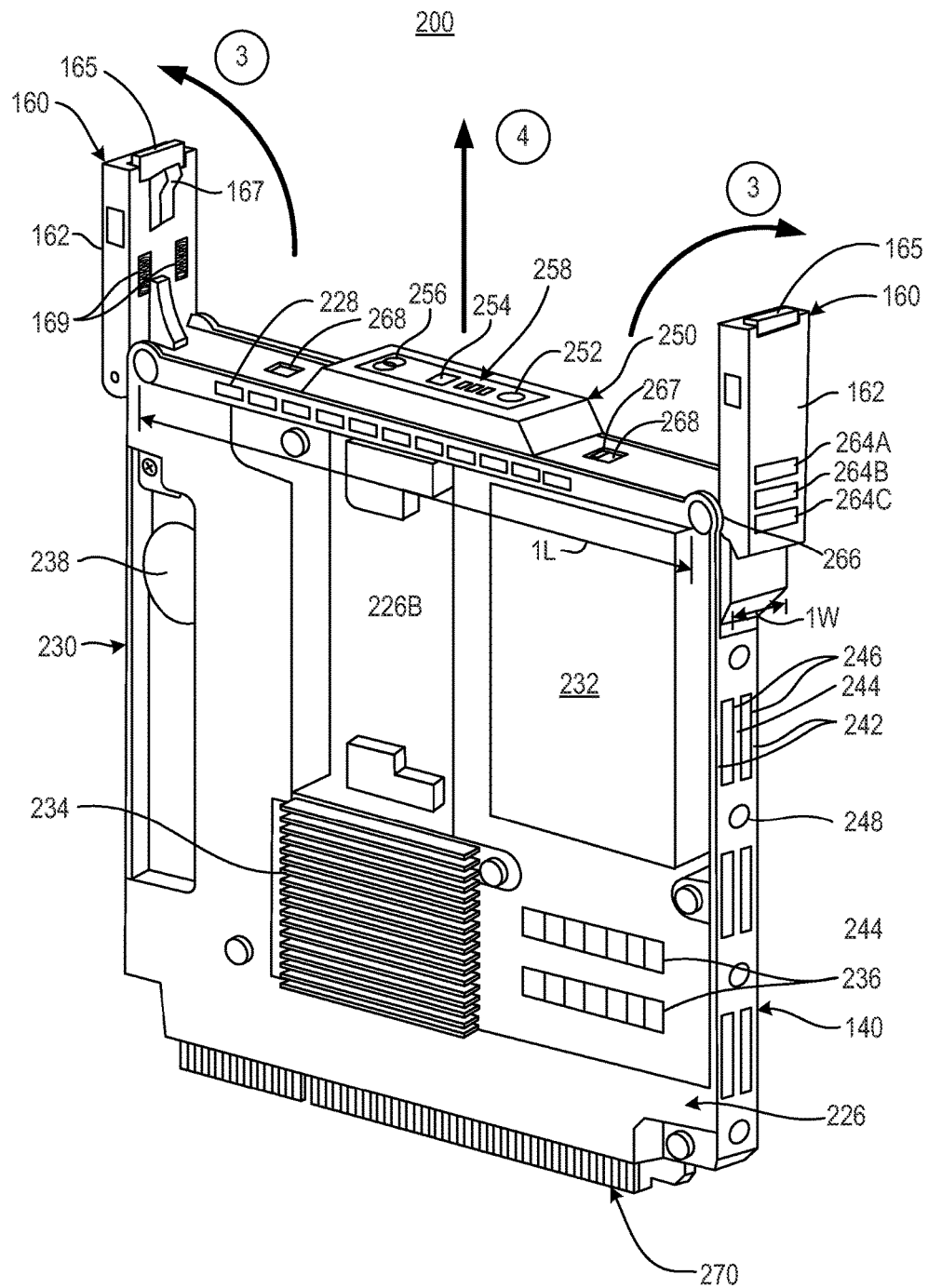

FIGS. 2A-2B illustrate perspective views of the top loading cartridge 100 of FIG. 1 according to an example. The top loading cartridge 100 illustrated includes the support member 120, the rail member 140, and the lock mechanism 160. Referring to FIG. 2A, the support member 120 as illustrated includes two side walls 222, a top wall 224, and a support wall 226. The two side walls 222 are spaced apart 246 from one another. The top wall 224 traverses the two side walls 222. The support wall 226 extends between the two side walls 222 to receive the electronic module. An outer surface 226A of the support wall 226 is illustrated in FIG. 2A. For example, the support wall 226 may be formed of a sheet metal.

FIG. 2B illustrates an inner surface 226B of the support wall 226 with an electronic module installed therein. For example, the electronic module may include a server module 230, a fan module, and/or a network switch module. FIG. 2B illustrates an example of the electronic module as a server module 230 that includes a hard drive 232, a heat sink 234, a memory module 236, and a battery 238. Additional components may be included.

The support member 120 further includes a lock receptacle 268 formed in the top wall 224 to receive the lock engagement member 167. The lock receptacle 268 includes a lock protrusion 267 extending therefrom to engage with the lock engagement member 167 and secure the housing 162 in a locked position $P_L$, illustrated in FIG. 3A. Referring to FIG. 2B, the support member 120 may further include an electromagnetic interface (EMI) gasket 228 (or EMI shielding). An EMI gasket 228 is illustrated along the top wall 224 of the support member 120.

As illustrated in FIGS. 2A-2B, the rail member 140 includes a first rail portion 242 and a second rail portion 244. The first rail portion 242 and the second rail portion 244 are spaced apart 246 from one another such that the first rail portion 242 mates with the support member 120 and the second rail portion 244 engages with the tray 282. The rail member 140 may be formed of a plastic with apertures or voids therein to form the area that makes the first rail portion 242 and the second rail portion 244 spaced apart 246 from one another. For example, the first rail portion 242 may be formed of a planar member, and the second rail portion 244 may be formed with an arc or convex surface extending from the side wall 222 or the first rail portion 242. The rail member 140 may be attached to the support member 120 via a fastener 248, such as a screw.

The rail member 140 engages with a guide rail 284 that lies along the tray 282, as illustrated in FIG. 2A. The tray 282 includes openings 283 to receive the top loading cartridges 100 and guide rails 284 to align the top loading cartridges 100. The size of the opening 283 formed in the tray 282 may vary depending on the size of the top loading cartridges 100 intended to be loaded therein. For example, one cartridge slot is used to refer to a standard length and width illustrated in FIGS. 2A-2B. Other sizes will be referred to based on the standard length 1L and width 1W. The guide rail 284 may be formed of a sheet metal that forms a track or rail that receives the rail member 140. For example, the rail member 140 slides into the guide rail 284 or vice versa. The rail member 140 and the guide rail 284 are formed to reduce vibration and provide a tight fit between the top loading cartridge 100 and the tray 282.

The lock mechanism 160 moves between a locked position $P_L$ (further illustrated in FIGS. 3A-3F) and an unlocked position $P_U$. The lock mechanism 160 includes the housing 162, the tray engagement member 164, a tab 165, a lock engagement member 167, and a resilient member 169. The housing 162 to hingedly attach to the support member 120. A tray engagement member 164 to extend from the housing 162 to engage with a tray 282 attached to a chassis 280. For example, the tray engagement member 164 includes a tray hook 166 that moves with the housing 162 simultaneously or as a unitary member. The housing 162 and the tray engagement member 164 are formed to rotate about the hinge 262 where the housing 162 attaches to the support member 120. The hinge 262 is formed, for example, by inserting a fastener 263 through a support aperture 265 formed in the support member 120 and a housing aperture 266 formed in the housing 162 to enable the housing 162 to pivot or rotate about the support member 120.

Figure 2C:
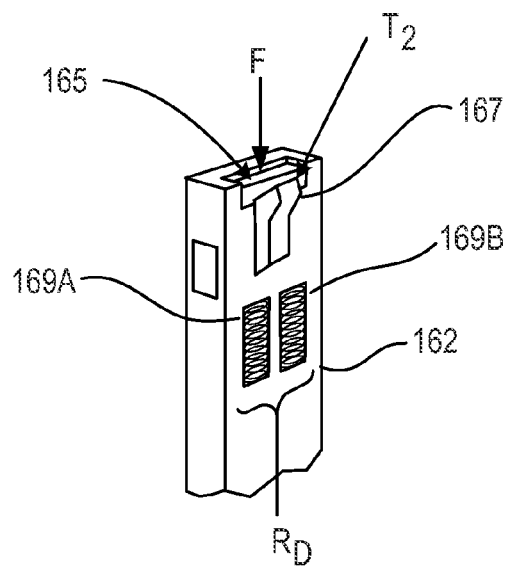
FIGS. 2C-2D illustrate enlarged views of a portion of the lock mechanism of FIGS. 2A-2B according to examples.
Figure 2D:
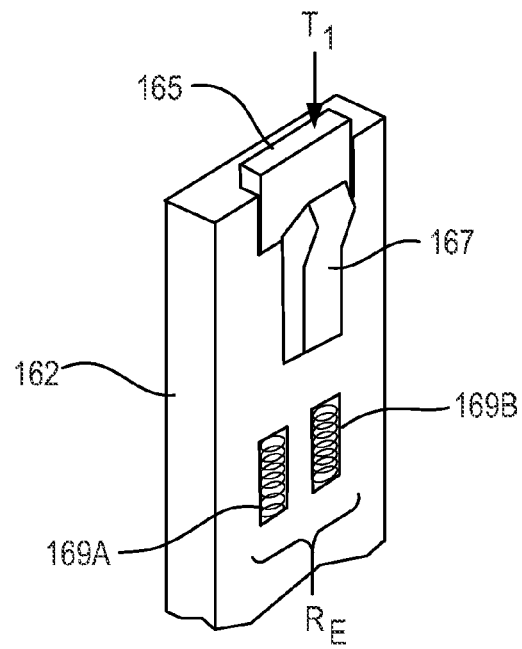

The tab 165 to connect to the housing 162. The tab 165 is moveable between a first position $T_1$ and a second position $T_2$. FIGS. 2C-2D illustrate enlarged views of a portion of FIGS. 2A-2B according to an example. For example, in FIGS. 2B, 2D, the tab 165 is in the first position $T_1$, positioned to be protracted or extend from the housing 162. FIGS. 2A and 2D, the tab 165 is in the second position $T_2$, positioned to be retracted at least partially into the housing 162. The lock engagement member 167 to extend from the tab 165 to engage with the support member 120. The engagement with the support member 120 holds the lock mechanism 160 in place. The lock engagement member 167 to move with the tab 165 as a unitary member or simultaneously. For example, the lock engagement member 167 includes a lock hook 168 that moves with the tab 165 between the first position $T_1$ and the second position $T_2$.

The resilient member 169 to connect to the tab 165. The resilient member 169 is spring loaded and formed to move between an equilibrium position $R_E$ and a displaced position $R_D$. The resilient member 169 moves based on a force F applied to the tab 165. For example, the tab 165 remains in a first position $T_1$ when no force is applied to the tab 165. When the tab 165 is in the first position $T_1$, the resilient member 169 is in an equilibrium position $R_E$. When the tab 165 is in the second position $T_2$, a force F is applied to the tab 165. The force F moves the resilient member 169 to a displaced position $R_D$, for example, the resilient member 169 compresses. For example, the resilient member 169 includes at least one spring. FIGS. 2A-2D are illustrated to include two springs 169A, 169B per tab 165.

The top loading cartridge 100 may further include a display 250, as illustrated in FIG. 2B. The display 250 may include a power button 252, a unique identification (UID) button 254, and/or a link button 256 to indicate when the top loading cartridge 100 is properly installed and connected to the system board. The display 250 may also be illuminated using a plurality of light-emitting diodes (LED) 258 and may include additional features and/or indicators.

Referring to FIG. 2A, the top loading cartridge 100 may also include a keyed cartridge label 264 that provide a visual identification of the top loading cartridge 100. The keyed cartridge labels 264 may be formed of molded plastic and each have a distinct, shape, size, and/or color to identify the type of cartridge and to ensure proper placement and/or labeling on the top loading cartridge 100. For example, the top label 264A may identify the type of top loading cartridge 100 by color or icon. The middle label 264B may be used for branding, such as a product line, logo, or company name. The bottom label 264C may be used to provide a model number or serial number for the top loading cartridge 100.

Figure 3A:
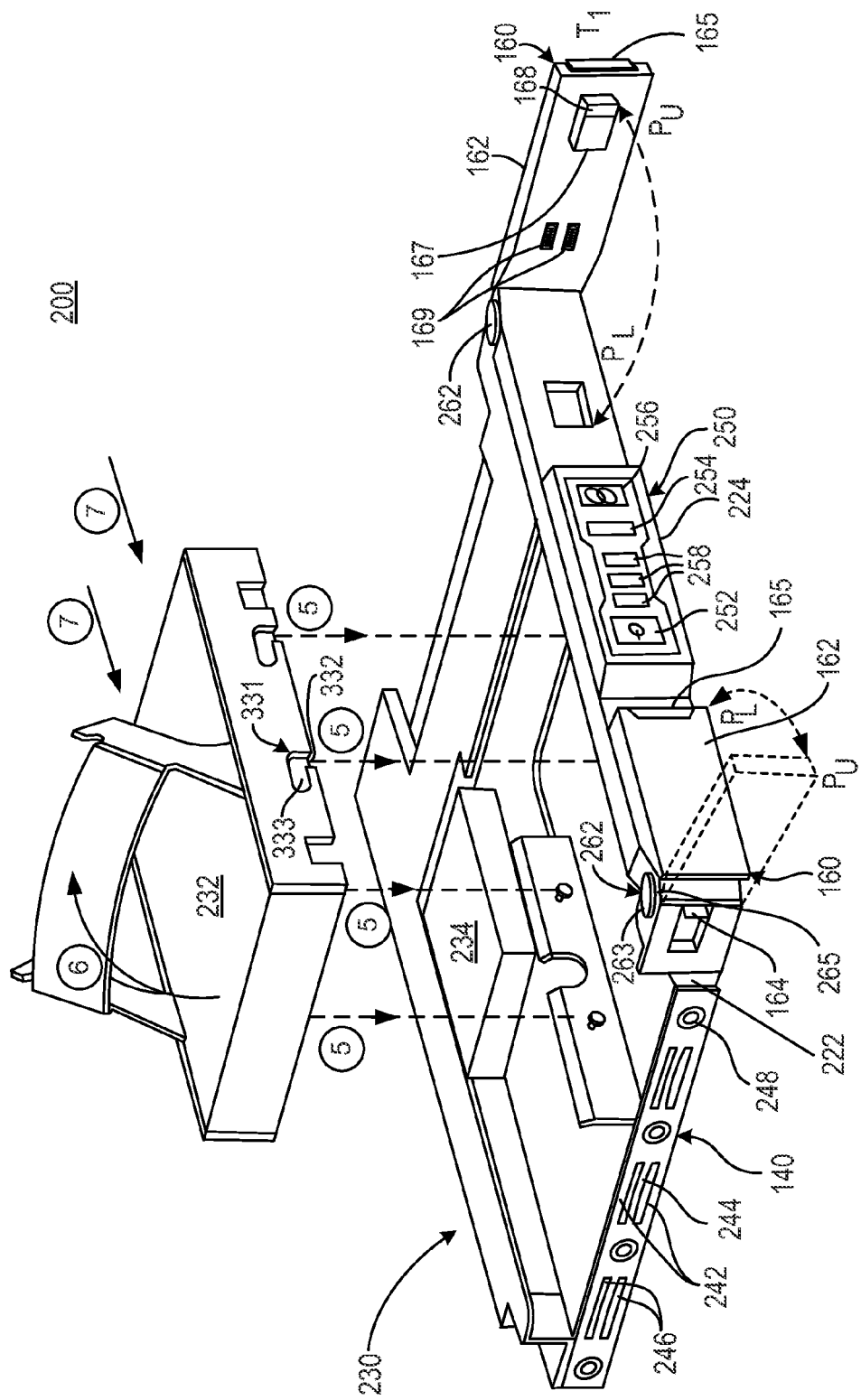
FIGS. 3A-3F illustrate perspective views of the top loading server cartridges of FIG. 1 according to examples.

For example, the top loading cartridge 100 may be inserted as illustrated in FIG. 2A. The lock mechanism 160 is positioned with the housing 162 in an unlocked position $P_U$ and extended from the support member 120 such that the lock engagement member 167 is not engaged with the support member 120. The top loading cartridge 100 is pushed down or inserted as illustrated by arrow 1. After the top loading cartridge 100 is inserted, the lock mechanism 160 moves to the locked position $P_L$ by rotating the housing 162 as illustrated by arrows 2. To move into the locked position $P_L$, a force F is applied to the tab 165 to move the tab 165 into a second position $T_2$, which moves the lock engagement member 167 and compresses or displaces the resilient member 169 into position $R_D$ (i.e., FIG. 2C). Movement of the tab 165 into the second position $T_2$ enables the lock engagement member 167 to fit into the lock receptacle 268. Release of the tab 165 moves the tab 165 back to the first position $T_1$ with the resilient member 169 in the equilibrium position $R_E$ (i.e., FIG. 2D). FIG. 3A below illustrates the locked position $P_L$. In the locked position $P_L$, the tray engagement member 164 engages with the tray 282 and the lock engagement member 167 engages with the support member 120, i.e., the lock receptacle 268 and the lock protrusion 267.

FIG. 2B illustrates the removal of the top loading cartridge 100, where the top loading cartridge 100 is, for example, a server cartridge 200. The removal begins with application of the force F to the tab 165 to move the tab 165 into a second position $T_2$, which moves the lock engagement member 167 and compresses or displaces the resilient member 169 into position $R_D$. When the tab 165 is in the second position $T_2$, the lock mechanism 160 can be moved into an unlocked position $P_U$ by rotating the housing 162 as illustrated by arrows 3. After the lock mechanism 160 is in the unlocked position $P_U$, the top loading cartridge 100 may be removed from the tray 282, as illustrated by arrow 4. The top loading cartridge 100 further includes board connector 270 that connects the top loading cartridge 100 to the system board to enable communication therebetween. Examples of board connectors 270 include high speed connectors or Peripheral Component Interconnect (PCI) express connectors.

FIGS. 3A-5B illustrate examples of the electronic modules that may be used with the top loading cartridge 100. FIGS. 3A-3F illustrate perspective views of the top loading server cartridge 200. Each of the server cartridges 200 illustrated has the lock mechanism 160 with the housing 162 in the locked position $P_L$. In the locked position $P_L$, the housing 162 is connected to the support member 120 and the lock engagement member 167 engages with the support member 120 via the lock receptacle 268 and the lock protrusion 267. The tab 165 is in a first position $T_1$ and the resilient member 169 is in an equilibrium position $R_E$ or near an equilibrium position $R_E$, such that the lock mechanism 160 remains in the locked position $P_L$.

Referring to FIG. 3A, the server cartridge 200 is illustrated prior to installation into the tray 282. The server cartridge 200 includes a hard drive 232 and a heat sink 234. The hard drive 232 is illustrated as being installed into the server cartridge 200 with the server cartridge 200 lying on a support wall 226. The hard drive 232 is inserted into the support member 120 and positioned against the support wall 226, as illustrated by arrow 5. The handle 233 of the hard drive 232 is rotated to extend from the hard drive 232 during insertion. After the hard drive 232 is inserted into the support member 120 the handle 233 may be rotated to lay against the hard drive 232, as illustrated by the motion of arrow 6. Rotation of the handle 233 causes the hard drive 232 to move into the proper position in the support member 120, as illustrated by arrows 7. The hard drive 232 is illustrated as including an L-shaped alignment member 331 that aligns the hard drive 232 by allowing the hard drive 232 to be inserted via a first alignment portion 332 when inserted through an alignment pin 334 as illustrated by the motion of arrow 5. A second alignment portion 333 positions the hard drive 232 as the handle 233 is rotated by the motion of arrow 6. The second alignment portion 333 guides the hard drive 232 as illustrated by the motion of arrows 7. This positions and locks the hard drive 232 securely in the server cartridge 200.

Figure 3B:
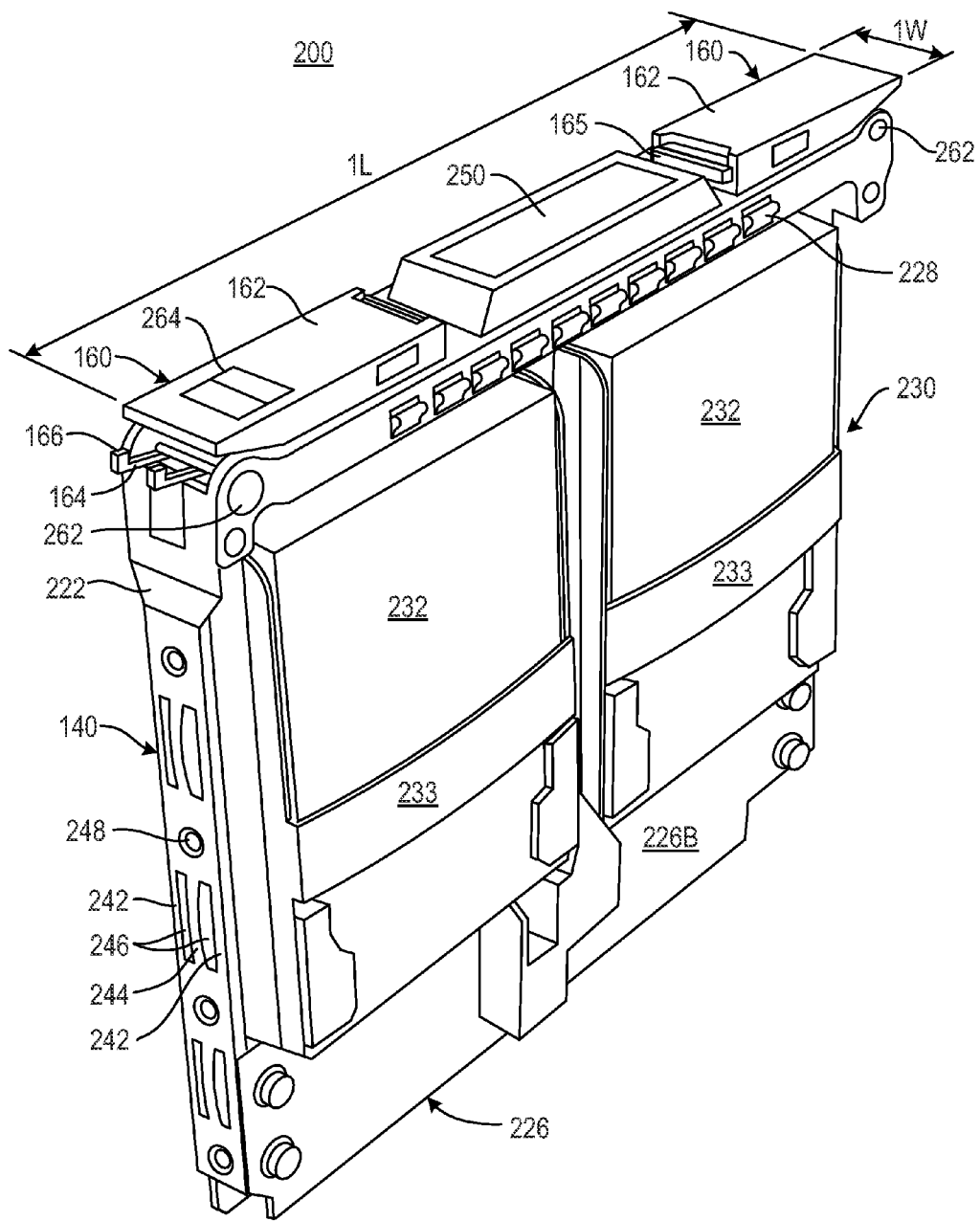
Figure 3C:
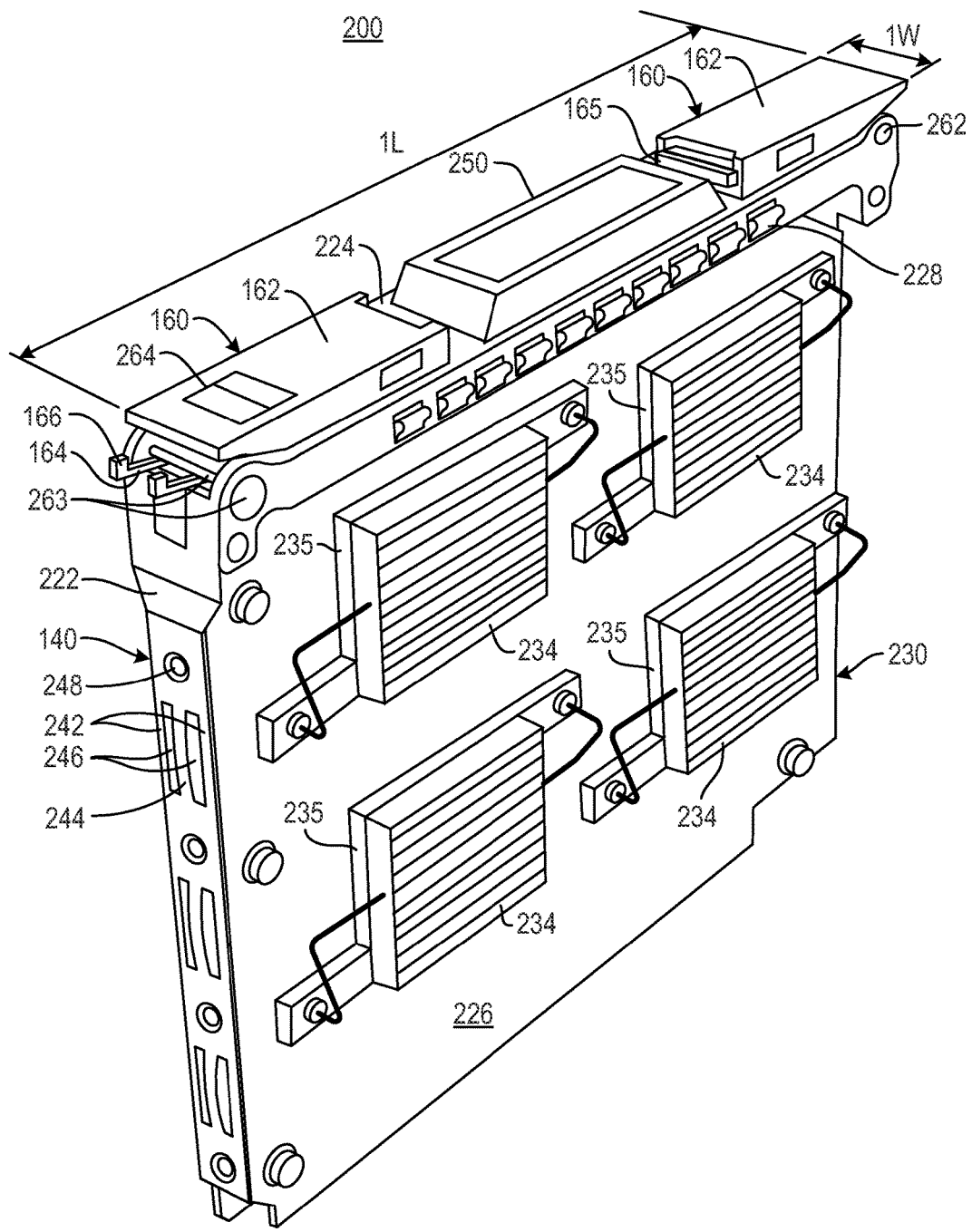
Figure 3D:
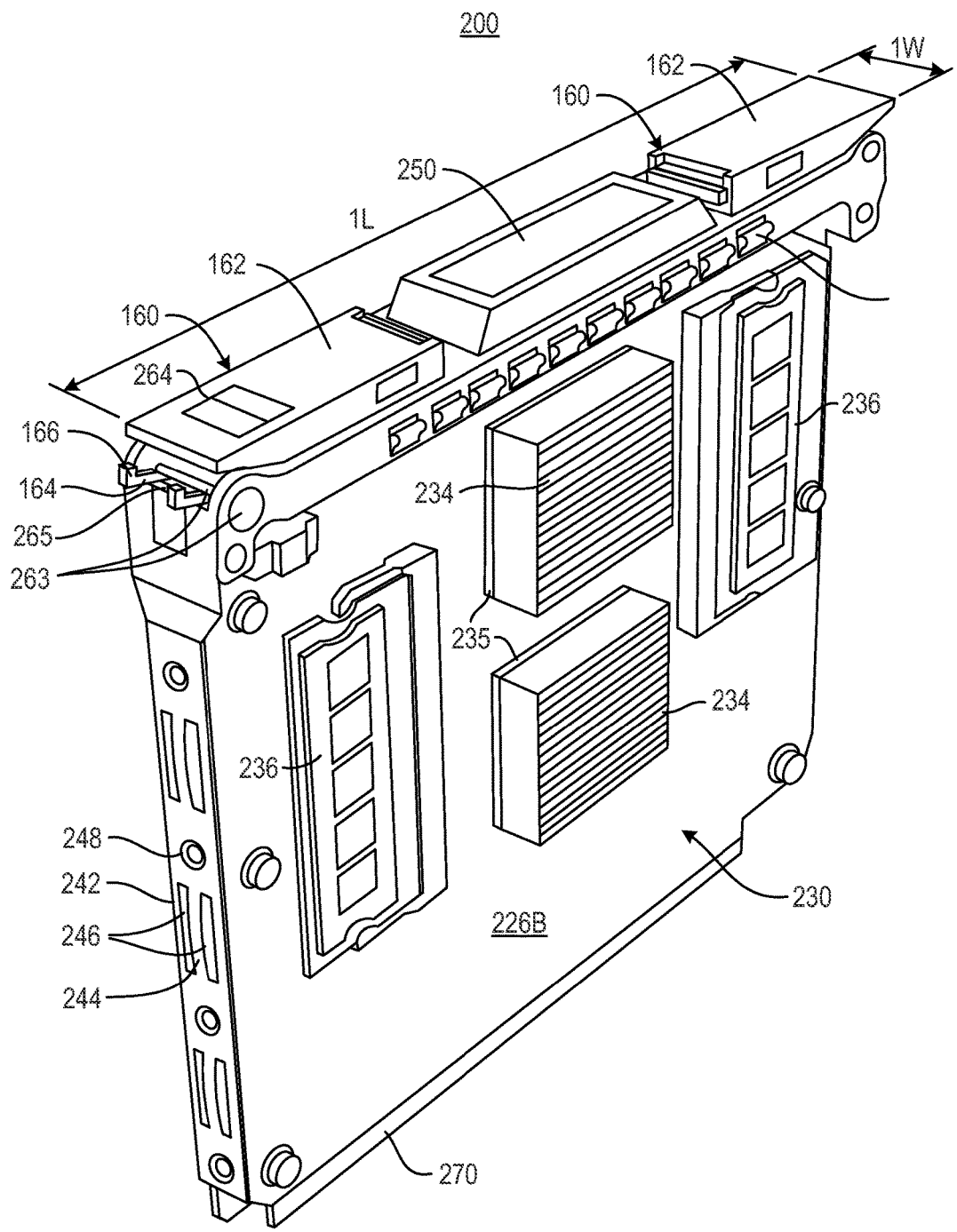
Figure 3E:
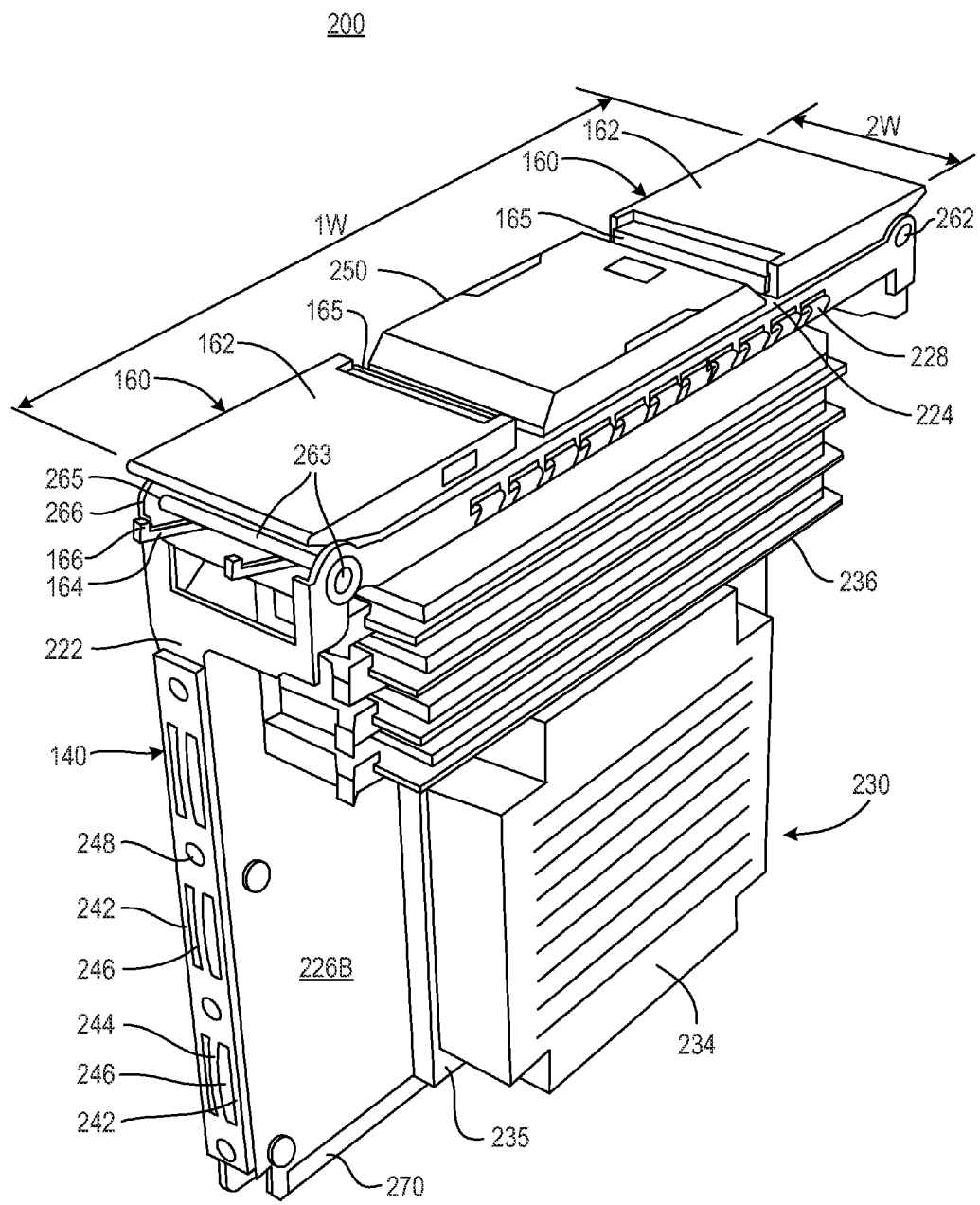
Figure 3F:
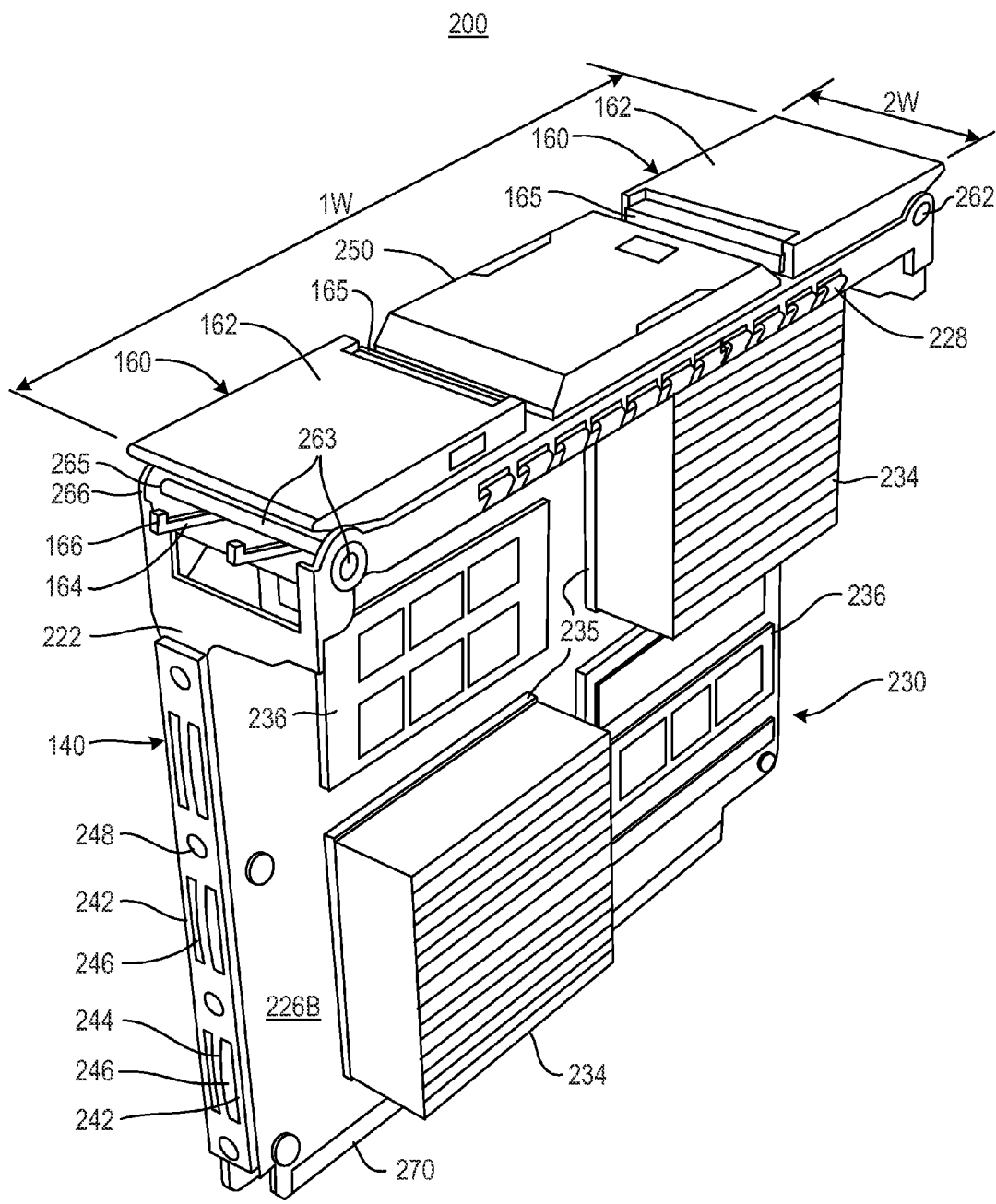

Referring to FIGS. 3B-3F, examples of other server cartridge 200 arrangements are illustrated. In FIG. 3B a server cartridge 200 for storage is illustrated. The server cartridge 200 includes two hard drives 232. FIG. 3C illustrates a server cartridge 200 having four processors 235 with four heat sinks 234 connected thereto. The server cartridge 200 illustrated in FIG. 3D includes two processors 235 with two heat sinks 234 and two memory modules 236. FIGS. 3E-3F illustrate server cartridges 200 that have the same length as the server cartridges 200 of FIGS. 3A-3D, but have a larger width that takes up two cartridge slots 2W in the tray 282. For example, FIG. 3E illustrates a server cartridge 200 with memory modules 236 that include four sets of full size DIMMs and a processor 235 with a heat sink 234. The server cartridge 200 illustrated in FIG. 3F includes two memory modules 236 and two processors 235.

Figure 4A:
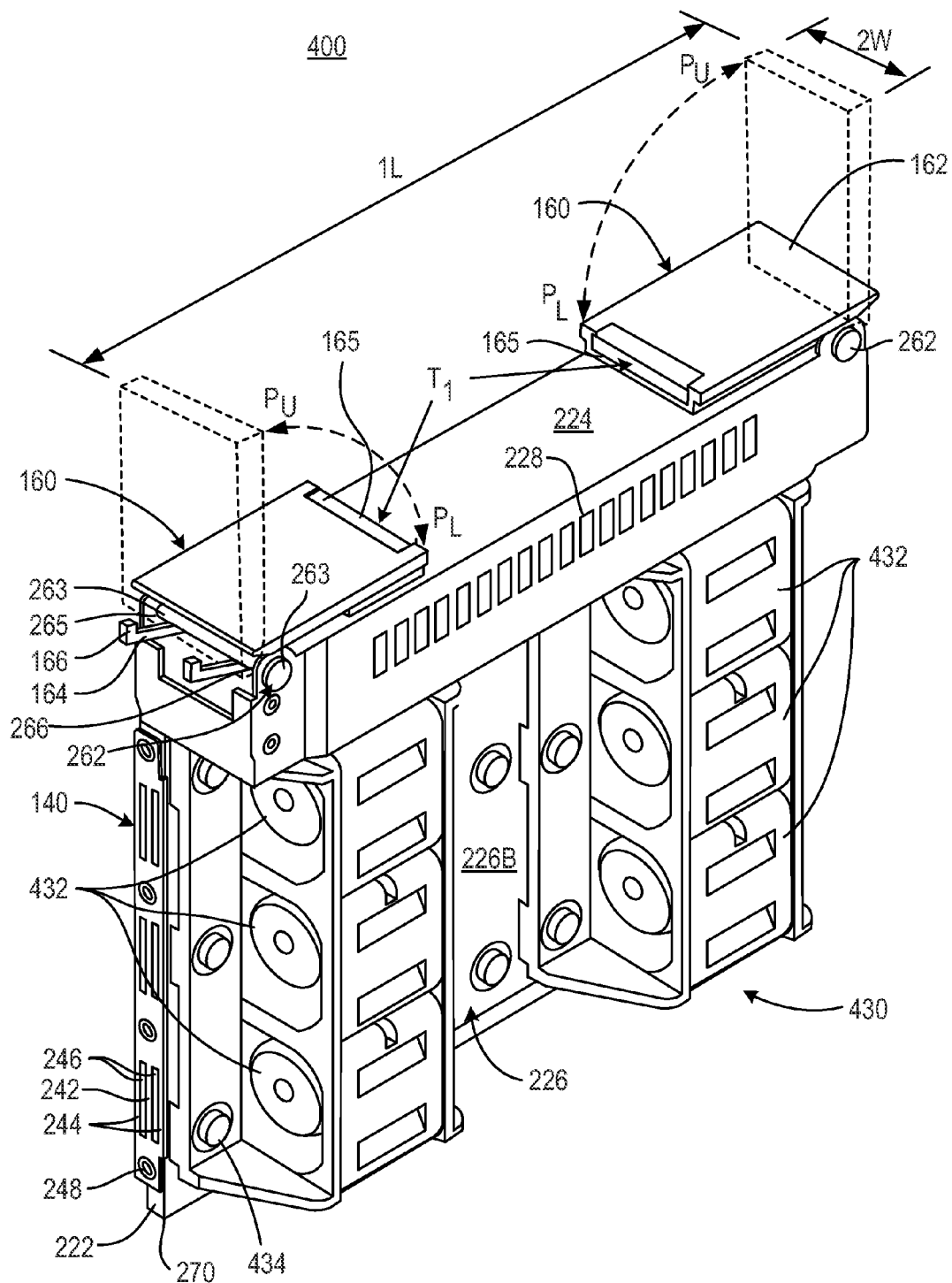
FIGS. 4A-4B illustrate perspective views of the top loading fan cartridge of FIG. 1 according to examples.
Figure 4B:
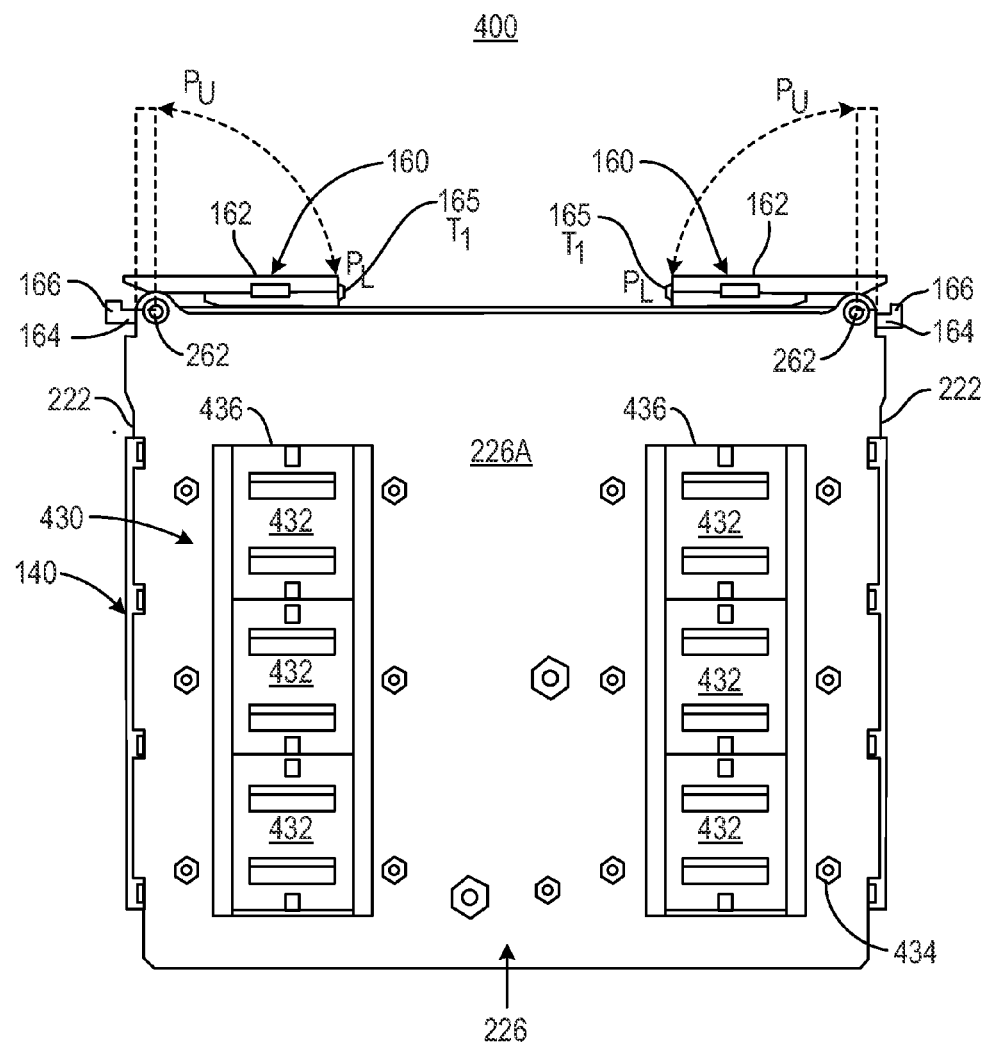
Figure 8:
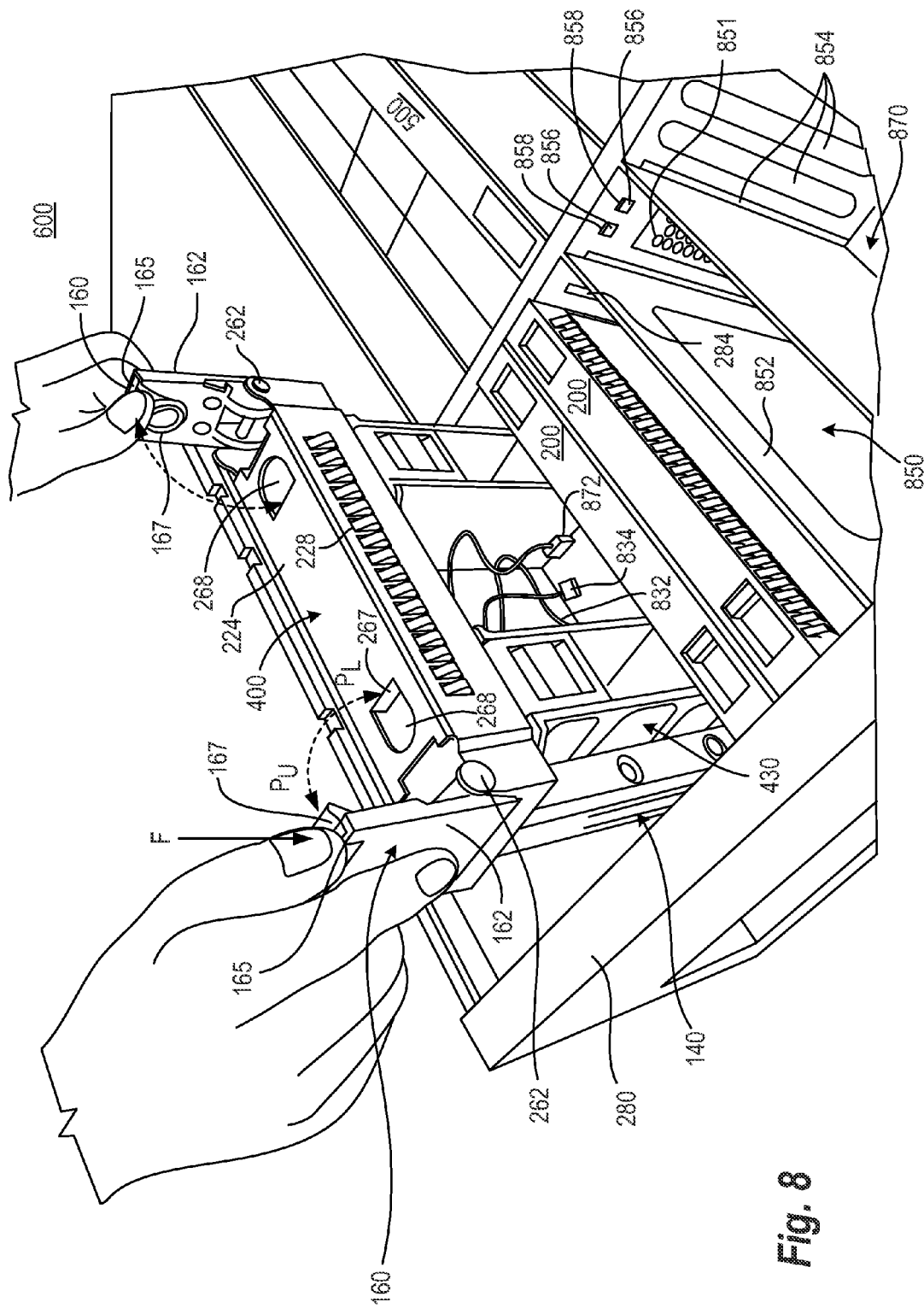

FIGS. 4A-4B illustrate perspective views of the top loading fan cartridge 400 of FIG. 1 according to examples. The fan cartridge 400 includes the support member 120 with an EMI gasket 228 along the top wall 224, rail member 140 attached to the side walls 222 of the support member 120, and lock mechanism 160 hingedly attached to the top wall 224 of the support member, as discussed and illustrated above with reference to FIGS. 1-3B. The size of the fan cartridges 430 are the width of two cartridge slots 2W and length of one cartridge slot 1L. As such, the fan cartridge 400 may be wider than the server cartridges 200 illustrated in FIGS. 3A-3D above. The fan cartridge 400 may receive power from a board connector 270 connected to the system board or a set of wires and batteries that communicate with the system board. The portion of the tray 282 that receives the fan module 430 may include air apertures (as illustrated in FIG. 8) that circulate air from the fans 432 and the fan modules 430 throughout the tray 282.

FIG. 4A illustrates a view of the fans 432 mounted or attached to an inner surface 226B of a support wall 226 of the support member 120. The fans 432 are attached using fasteners 434, such as screws, but may also be attached by other methods. The fan cartridge 400 is illustrated to include a plurality of fans 432. Six fans 432 are illustrated in two rows of three fans 432; however, any arrangement and number of fans 432 may be attached to the support member 120. Referring to FIG. 4B, a view of an outer surface 226A of the support wall 226 is illustrated. The support wall 226 includes fan apertures 436 that are formed in the sheet metal of the support wall 226 to enable the fan module to be mounted therein.

Figure 5A:
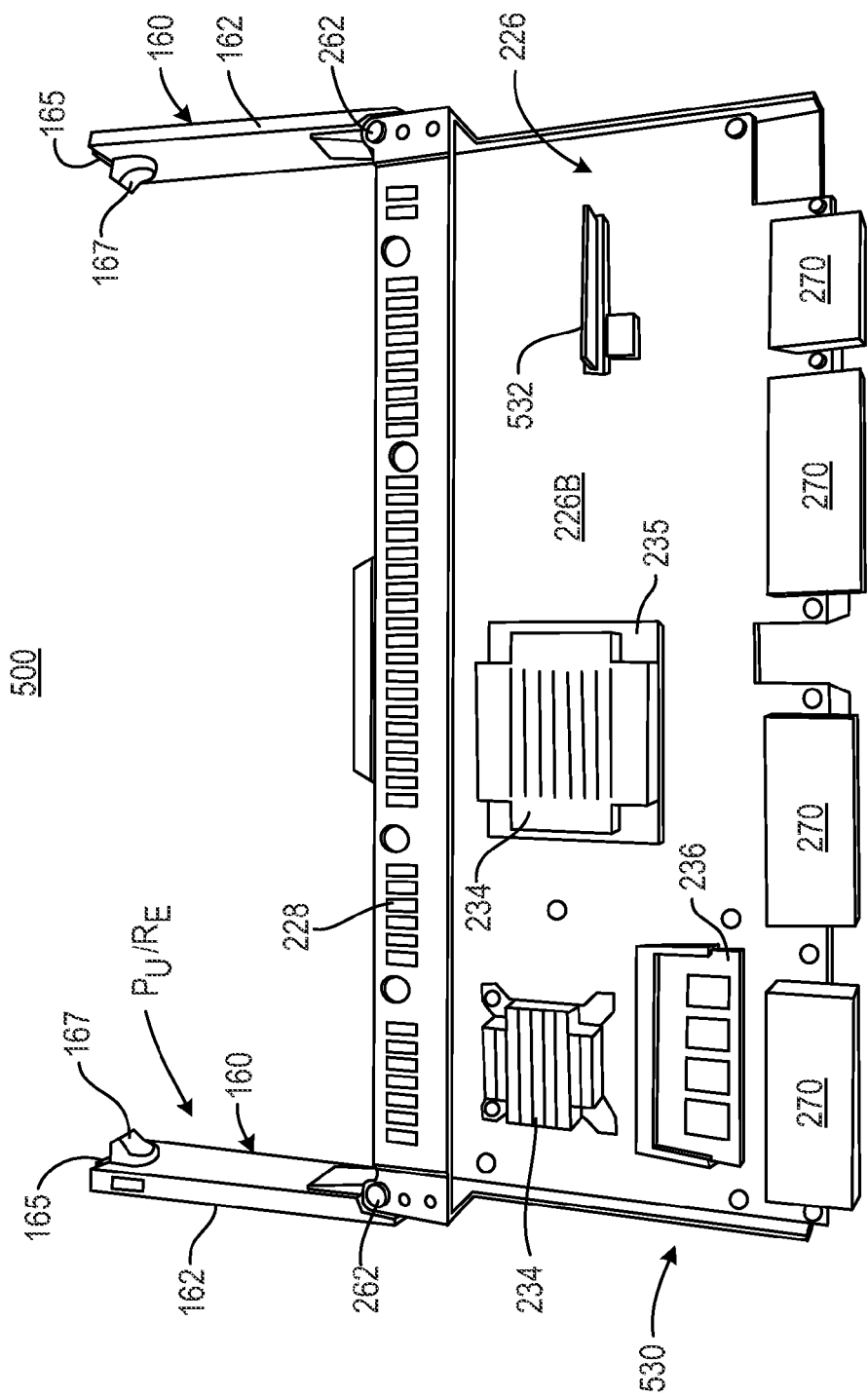
FIGS. 5A-5B illustrate perspective views of the top loading network switch cartridge of FIG. 1 according to examples.
Figure 5B:
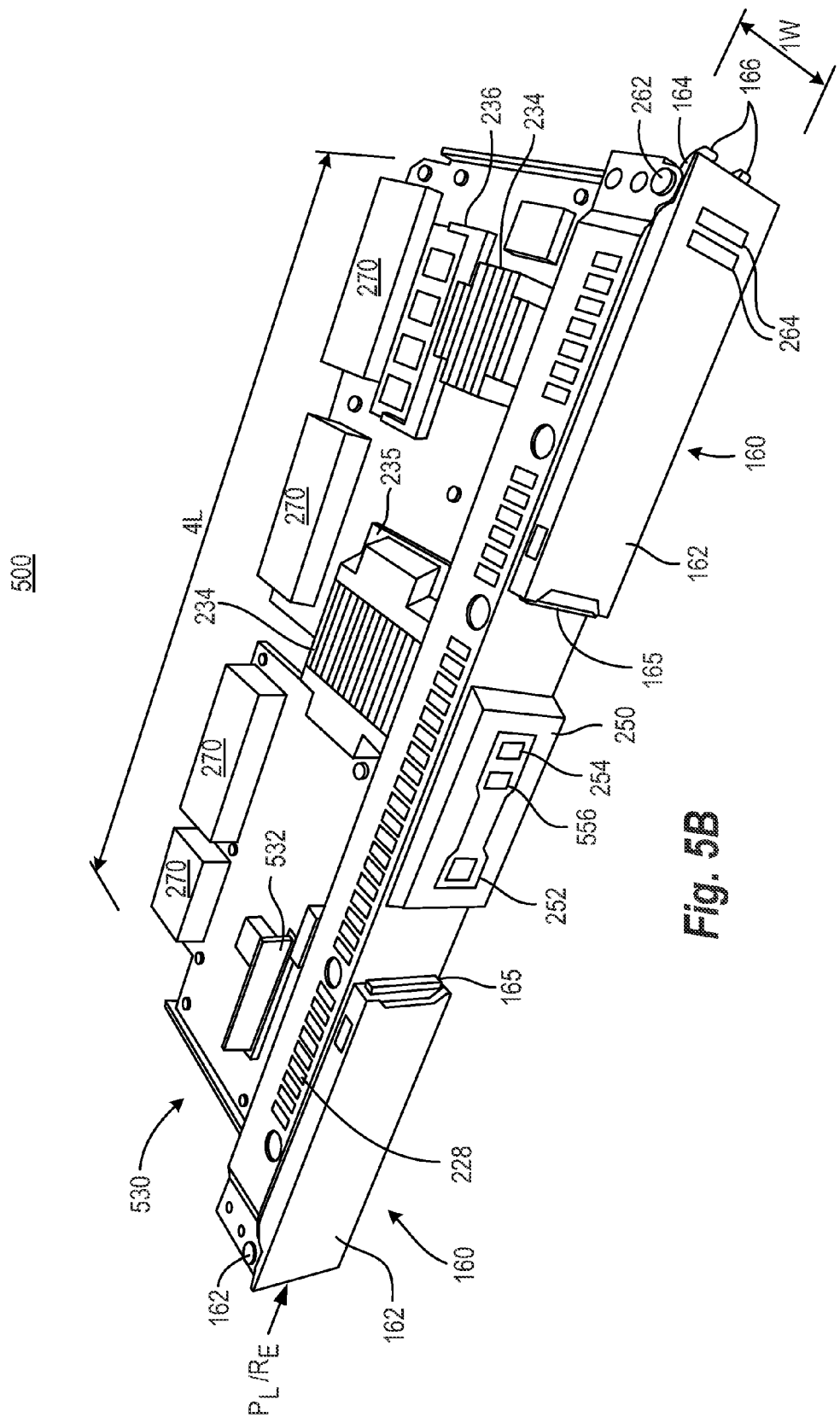

FIGS. 5A-5B illustrate perspective views of the top loading network switch cartridge 500 of FIG. 1 according to examples. The network switch cartridge 500 includes the support member 120 with an EMI gasket 228 along the top wall 224, rail member 140 attached to the side walls 222 of the support member 120, and lock mechanism 160 hingedly attached to the top wall 224 of the support member, as discussed and illustrated above with reference to FIGS. 1-2B. The size of the network switch cartridges 500 have the width of one cartridge slot 1W and an elongated length. For example, the length of the network switch cartridge 500 may be equivalent to the length of four server cartridges 200 or cartridge slots 4L.

FIG. 5A illustrates a side view of the network switch cartridge 500 with the network switch 532 visible. The network switch 532 includes a distant remote switching module (DRM), heat sinks 234, and a memory module 236, such as SO-DIMMs. The network switch cartridge 500 connects to the system board via board connectors 270, such as high speed connectors or PCI express connectors. The network switch cartridge 500 is illustrated with the lock mechanism 160 in the unlocked position $P_U$ with the tab 165 in the first position $T_1$ and the resilient member 169 in the equilibrium position $R_E$.

Referring to 5B, a view of the top of the network switch is illustrated. The lock mechanism 160 is illustrated with the housing 162 in the locked position $P_L$. In the locked position $P_L$, the lock engagement member 167 is engaged with the support member 120, the tab 165 is in the first position $T_1$, and the resilient member 169 is in the equilibrium position $R_E$. The display 250 is on the top wall 224 with a power button 252, a link button 256, and a thermal detection button 556 that detects proper installation using, for example an optical sensor.

Figure 6:
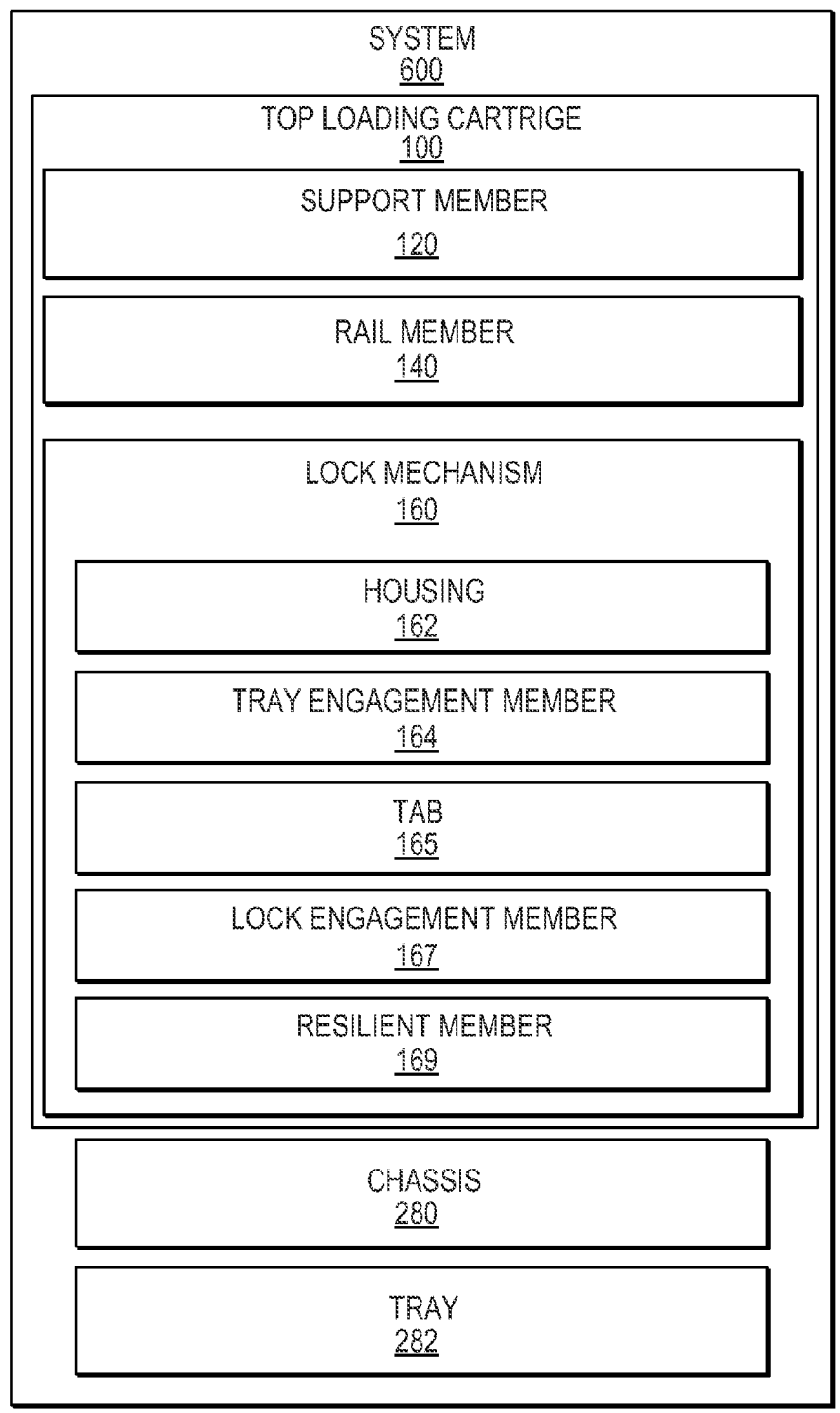
FIG. 6 illustrates a block diagram of a system for modular computing according to an example.

FIG. 6 illustrates a block diagram of a system 600 for modular computing according to an example. The system 600 provides a server with shared chassis, power, cooling, storage, fabric, and management. The system 600 includes a top loading cartridge 100, a chassis 280, and a tray 282. The top loading cartridge 100 includes a support member 120, a rail member 140, and a lock mechanism 160 as illustrated and described above. The chassis 280 to receive the top loading cartridge 100. The tray 282 to attach to the chassis 280 and align the top loading cartridge 100 in the chassis 280.

Figure 7:
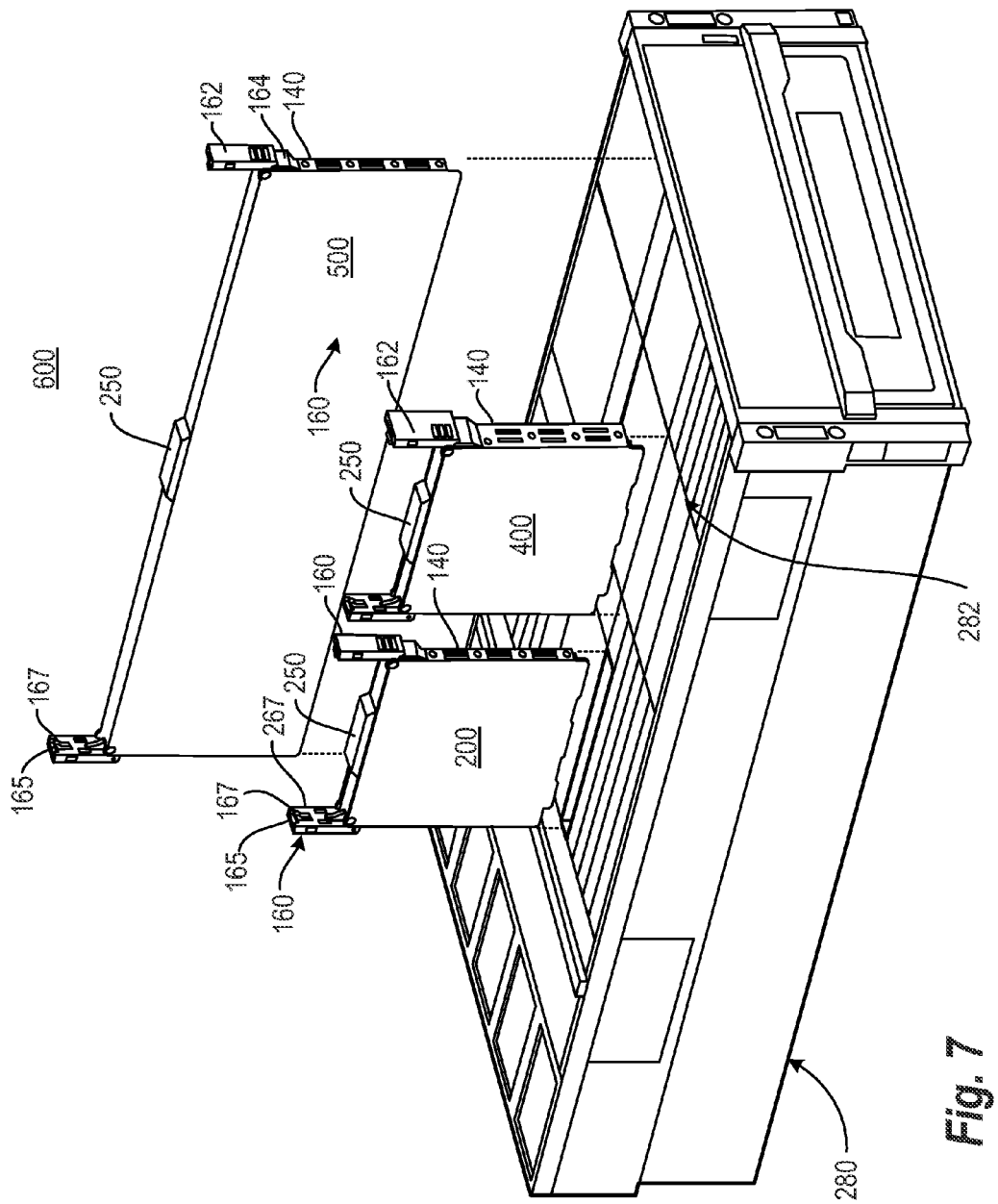
FIGS. 7-8 illustrate examples of the system of FIG. 6 according to examples.

FIGS. 7-8 illustrate examples of the system 600 of FIG. 6 according to examples. Referring to FIG. 7, the system 600 is illustrated to include the chassis 280 with a tray 282 attached to the chassis 280. The tray 282 aligns the top loading cartridge(s) 100 in the chassis 280. For example, the chassis 280 and the tray 282 may be formed to receive a combination of the server cartridge 200, the fan cartridge 400, and the network switch cartridge 500; however, the chassis 280 and the tray 282 may be formed to receive a single type of cartridge and/or additional cartridges. FIG. 7 illustrates a partially exploded view of the top loading cartridges 100. The chassis 280 and tray 282 illustrated are designed to receive a combination of top loading cartridges 100, such as the server cartridges 200, the fan cartridges 400, and/or the network switch cartridges 500.

As discussed above, the top loading cartridge 100 includes the support member 120 to receive an electronic module, such as a server module 230, a fan module 430, and/or a network switch module 530. The rail member 140 attaches to the support member 120 to engage with the tray 282 that receives the top loading cartridge 100. The lock mechanism 160 to lock the top loading cartridge 100 in the tray 282. The lock mechanism to move between a locked position $P_L$ and an unlocked position $P_U$. The lock mechanism 160 includes a housing 162, a tray engagement member 164, a tab 165, a lock engagement member 167, and a resilient member 169.

Referring to FIG. 8, the system 600 further includes a system board 870 coupled to the chassis 280. The system board 870 to connect with the top loading cartridge 100 to enable communication therebetween. For example, the system board 870 may connect to the server cartridge 200 via a board connector 270. The system board 870 may connect to the fan cartridge 400 via a board connector 270 or via a communication connector 872 when the fans 432 are powered by wires 832 and batteries 834. The system board 870 may connect to the network switch cartridge 500 via the board connector 270.

The tray 282 includes tray inserts 852 to form cartridge slots 850 that receive the top loading cartridges 100. The tray inserts 852 are inserted into the tray along a tray alignment member 854 formed in the tray 282. The tray inserts 852 may be removable to accommodate top loading cartridges 100 that require, for example, one cartridge slot (i.e., server cartridge 200), two cartridge slots (i.e., server cartridge 200 or fan cartridge 400), or four cartridge slots (i.e., network switch cartridge 500). The tray 282 is illustrated to include the guide rails 284 to mate with the rail member 140. The first rail portion 242 lies flush with the support member 120. The second rail portion 244 is spaced apart 246 from the support member 120 to engage with the guide rail 284 and reduce vibration of the top loading cartridge 100. The first and second portions 242, 244 of the rail member 140 may be spaced apart 246 using, for example, apertures or voids in the plastic portion that forms the rail member 140. For example, the first rail portion 242 may be formed of a planar member, and the second rail portion 244 may be formed with an arc or convex surface extending from the side wall 222 or the first rail portion 242.

The tray 282 may further include air apertures 851 formed therein that circulate air from the fans 432 and the fan modules 430 throughout the tray 282. The tray 282 is further illustrated to include a tray receptacle 856 to receive and engage with the tray engagement member 164. The tray receptacle 856 may further include a tray protrusion 858 that engages with the tray engagement member 164, such as a tray hook 166, and secures the top loading cartridge 100 in the tray 282. The tray receptacle 856 and tray protrusion 858 may also be referred to as a camming surface and the tray engagement member 164 may also be referred to as a cam that engages with the camming surface.

FIG. 8 illustrates sever cartridges 200 installed and a fan cartridge 400 partially inserted. The fan cartridge 400 is illustrated with the lock mechanism 160 being used to insert the fan cartridge 400 into the tray 282. The housing 162 is in an unlocked position $P_U$ with the tabs 165 in a first position T1. After the fan cartridge 400 is inserted into the tray 282, the lock mechanism 160 rotates between the unlocked position $P_U$ and a locked position $P_L$. In the locked position $P_L$, the lock engagement member 167 engages with the support member 120 and the tray engagement member 164 engages with the tray 282. For example, as illustrated in FIGS. 2C-2D, a force F is applied to the tab 165 as the housing 162 is rotated to move the lock engagement member 167 into the receptacle 268. When the force F is applied to the tab 165, the tab 165 is in a second position $T_2$ and the resilient member 169 is in a displaced or compressed position $R_D$. The force F is removed from the tab 165 to enable the lock engagement member 167, such as a lock hook 168, to engage with a lock protrusion 267. When the force F is removed the tab 165 returns to a first position $T_1$ and the resilient member 169 returns to an equilibrium position $R_E$.

FIGS. 9-10 illustrate flow charts 900 and 1000 of methods for modular computing using a top loading cartridge according to examples. The method inserts the top loading cartridge into a tray attached to a server chassis, in block 920. The top loading cartridge includes a support member, a rail member, and a lock mechanism. The support member to receive an electronic module. The rail member attached to the support member to engage with a tray that receives the top loading cartridge. The lock mechanism to move between a locked position and an unlocked position. The lock mechanism includes a housing, a tray engagement member, a tab, a lock engagement member, and a resilient member. The housing to hingedly attach to the support member. The housing rotates to move the lock mechanism between the locked position and the unlocked position. The tray engagement member to extend from the housing to engage with a tray attached to a chassis. The tab to connect to the housing. The tab moveable between a first position and a second position. The lock engagement member to extend from the tab to engage with the support member. The resilient member to connect to the tab. The resilient member to move between an equilibrium position and a displaced position based on a force applied to the tab.

The lock mechanism rotates towards a locked position in block 940. For example, the housing of the lock mechanism rotates between a locked position and an unlocked position. In the locked position, the tray engagement member engages with the tray and the lock engagement member engages with the support member. In block 960, the force is applied to the tab to move the tab between a first position and a second position. As the tab is in the second position, with the force applied, the lock mechanism may be moved into the locked position. The tab is released after the lock mechanism moves into the locked position, in block 980. Release of the tab causes the lock engagement member to engage with the support member via the lock protrusion, the tray engagement member to engage with the tray via the tray protrusion, and attach the top loading cartridge to the tray.

FIG. 10 illustrates the flow chart 1000 for removal of the top loading cartridge. In block 1020, a force is applied to the tab to move the tab between the first position and the second position. The lock mechanism is rotated towards the unlocked position in block 1040. The tab is released in block 1060 after the lock mechanism moves into the unlocked position. The top loading cartridge is removed from the tray in block 1080, for example, by lifting up the top loading cartridge out of the tray.

Although the flow diagrams of FIGS. 9-10 illustrate specific orders of execution, the order of execution may differ from that which is illustrated. For example, the order of execution of the blocks may be scrambled relative to the order shown. Also, the blocks shown in succession may be executed concurrently or with partial concurrence. All such variations are within the scope of the present disclosure.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A top loading server cartridge comprising:
   a support member that receives a fan module;
   a rail member attached to the support member that engages with a tray that receives the top loading cartridge; and
   a lock mechanism including:
      a housing hingedly attaches to the support member and the housing rotates between an unlocked position to a locked position;
      a tab to connect to the housing, the tab moves with a lock engagement member between a first position and a second position;
      a hooked tray engagement member that is retracted in the housing in the unlocked position and extends from the housing to engage with the tray attached to a chassis in the second position;
      the lock engagement member that extends from the tab at least partially into a receptacle included in the support member; and
      a resilient member to connect to the tab, the resilient member moves the tab between an equilibrium position and a displaced position based on a force applied to the tab.

2. The top loading cartridge of claim 1, wherein the rail member includes a first rail portion and a second rail portion, the first rail portion and the second rail portion spaced apart from one another to mate the first rail portion with the support member and to engage the second rail portion with the tray.

3. The top loading cartridge of claim 1, wherein the fan module comprises six fans connected via a set of wires and powered by a battery.

4. The top loading cartridge of claim 1, wherein the fan module to receive power from a system board.

5. The top loading cartridge of claim 1, wherein the lock engagement member to move with the tab as a unitary member.

6. The top loading cartridge of claim 1, wherein when the housing is in the locked position, the hooked tray engagement member engages with the tray and the lock engagement member engages with the support member.

7. The top loading cartridge of claim 6, wherein the lock engagement member engages with the support member when the tab is in the first position and the housing is in the locked position.

8. The top loading cartridge of claim 1, wherein the support member includes a lock receptacle formed therein to receive the lock engagement member, the receptacle including a lock protrusion extending therefrom to engage with the lock engagement member and secure the housing in a locked position.

9. A system for modular computing, the system comprising:
   a top loading cartridge including:
      a support member to receive a fan module;
      a rail member attached to the support member to engage with a tray that receives the top loading cartridge; and
      a lock mechanism including:
         a housing that hingedly attach to the support member;
         a hooked tray engagement member to extend from the housing to engage with the tray attached to a chassis when the housing is rotated from an unlocked position to a locked position, the hooked tray engagement member retracts into the housing in the unlocked position;
         a tab that connects to the housing, the tab moves between a first position and a second position;
         a lock engagement member that extends from the tab at least partially into a receptacle included in the support member when the hooked tray engagement member is engaged with the tray; and
         a resilient member to connect to the tab, the resilient member to move between an equilibrium position and a displaced position based on a force applied to the tab;
   a chassis to receive the top loading cartridge; and
   the tray to attach to the chassis, the tray to align the top loading cartridge in the chassis.

10. The system of claim 9, further comprising a system board coupled to the chassis, the system board to connect with the top loading cartridge to enable communication therebetween.

11. The system of claim 9, wherein the tray further comprises a guide rail to mate with the rail member, the rail member includes a first rail portion and a second rail portion, the first rail portion to lie flush with the support member, the second rail portion spaced apart from the support member to engage with the guide rail.

12. The system of claim 9, wherein the support member comprises:
   two side walls spaced apart from one another;
   a top wall to traverse the two side walls; and
   a support wall to extend between the two side walls to receive the fan module.

13. The system of claim 9, wherein in the locked position the lock engagement member engages with the support member and the hooked tray engagement member engages with the tray.

14. The system of claim 9, wherein the tray further comprises a tray receptacle formed therein, the tray receptacle to receive the hooked tray engagement member, the tray receptacle including a tray protrusion extending therefrom to engage with the hooked tray engagement member and to secure the top loading cartridge therein.

15. The system of claim 9, wherein the tray further comprises a plurality of air apertures to circulate air from the fan module throughout the tray.

* * * * *